US012581856B1

(12) United States Patent

Cadano et al.

(10) Patent No.: US 12,581,856 B1

(45) Date of Patent: Mar. 17, 2026

(54) THERMOELECTRIC GENERATOR POWER GENERATION AT AN ATM

(71) Applicant: Cardtronics USA, Inc., Atlanta, GA (US)

(72) Inventors: Clemence Orl Ceriales Cadano, Cebu City (PH); Kenneth Supangan Rivera, Nangka (PH); Regine Topacio Solano, Bacolod City (PH)

(73) Assignee: Cardtronics USA, Inc., Atlanta, GA (US)

( * ) Notice: Subject to any disclaimer, the term of this patent is extended or adjusted under 35 U.S.C. 154(b) by 0 days.

(21) Appl. No.: 19/006,436

(22) Filed: Dec. 31, 2024

(51) Int. Cl.
 H10N 10/13 (2023.01)
 G07F 19/00 (2006.01)

(52) U.S. Cl.
 CPC ........... H10N 10/13 (2023.02); G07F 19/205 (2013.01)

(58) Field of Classification Search
 CPC ....... H10N 10/13; G07F 19/20; G07F 19/201; G07F 19/205
 See application file for complete search history.

(56) References Cited

U.S. PATENT DOCUMENTS

| | | | |
|---|---|---|---|
| 2022/0117459 A1* | 4/2022 | Wu | A47L 15/4217 |
| 2023/0273987 A1* | 8/2023 | Goodsitt | H04L 9/3226 |
| | | | 726/18 |
| 2023/0419281 A1* | 12/2023 | Smith | G06Q 20/40145 |

* cited by examiner

*Primary Examiner* — Mayla Gonzalez Ramos

(74) *Attorney, Agent, or Firm* — Schwegman Lundberg & Woessner, P.A.

(57) ABSTRACT

A system and technique may be used to generate power via a thermoelectric generator (TEG) at a through-the-wall automated teller machine (ATM). An example system may include a thermoelectric generator (TEG) configured to harness a temperature difference between an interior portion of the through-the-wall ATM and an environment external to the through-the-wall ATM to generate energy to power small devices in the through-the-wall ATM. The TEG may include a first face exposed to the interior portion of the through-the-wall ATM and a second face opposite the first face, the second face exposed to the environment.

20 Claims, 7 Drawing Sheets

100

104

102

SLEEVE

106

ATM FASCIA
AND TOPBOX

WALL

204

208

SLEEVE

206

ATM FASCIA
AND TOPBOX

WALL

THERMOELECTRIC GENERATOR POWER GENERATION AT AN ATM

BACKGROUND

A thermoelectric generator (TEG) converts heat into electricity using the Seebeck effect. When there is a temperature difference across a thermoelectric material, charge carriers (e.g., electrons) move from the hot side to the cold side, generating an electric current. TEGs are solid-state devices with no moving parts.

An Automated Teller Machine (ATM) is an electronic banking device that allows customers to perform financial transactions, such as withdrawing cash, checking account balances, and making deposits, without the need for a human bank teller. ATMs are typically connected to financial networks and are commonly located at bank branches, shopping centers, and other convenient public locations to provide easy access to banking services.

SUMMARY

In various examples, methods and systems for generating power via a thermoelectric generator (TEG) at a through-the-wall automated teller machine (ATM) are presented.

According to an example, an ATM may include a through-the-wall ATM. The through-the-wall ATM may include a thermoelectric generator (TEG) configured to harness a temperature difference between an interior portion of the through-the-wall ATM and an environment external to the through-the-wall ATM to generate energy to power the fan and the at least one LED, the TEG including a first face exposed to the interior portion of the through-the-wall ATM and a second face opposite the first face, the second face exposed to the environment.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various examples discussed in the present document.

DETAILED DESCRIPTION

Figure 1:
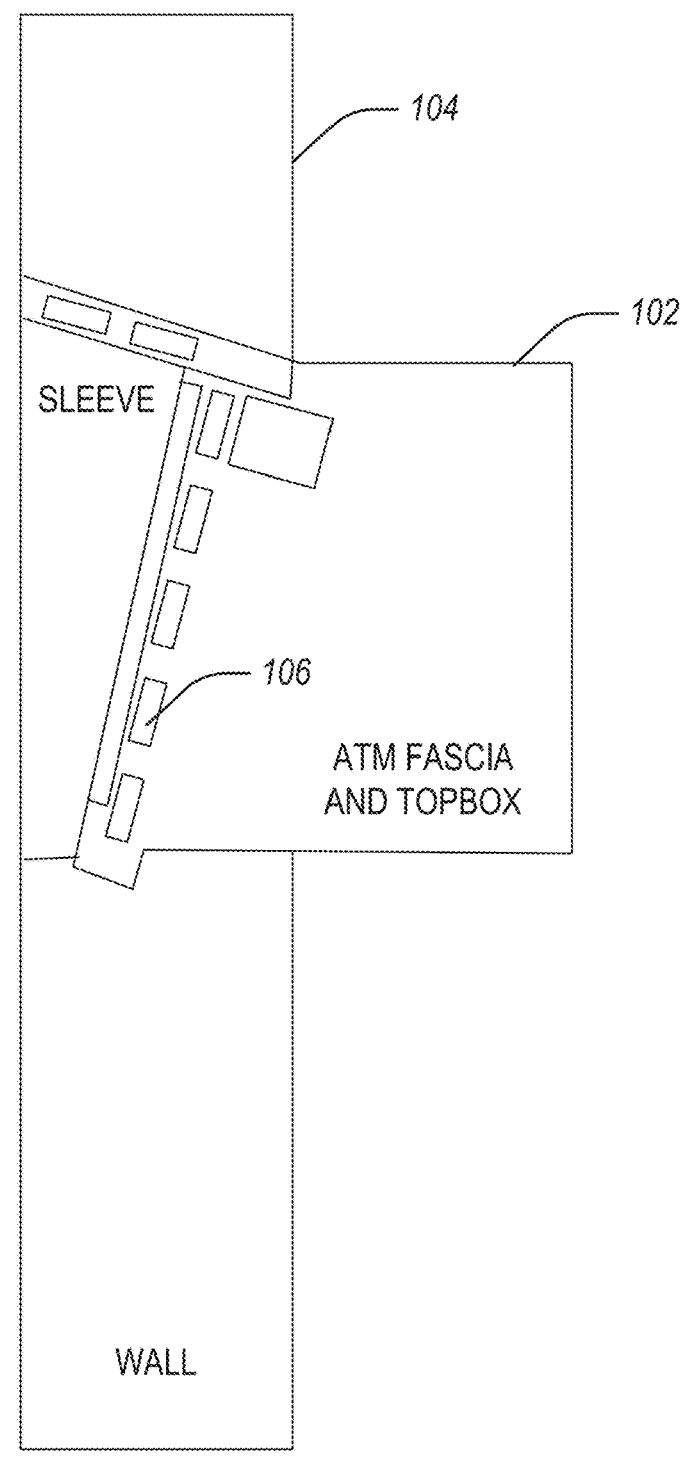
FIGS. 1-3 illustrate example ATMs with arranged TEGs in accordance with some examples.

The systems and techniques described herein provide components of an ATM with power by using at least one thermoelectric generator (TEG). The TEG may be used with an ATM that is a through the wall (TTW) ATM, such as an ATM installed in a wall. A TTW ATM may be installed in any wall, such as at a grocery store, a bank branch, a convenience store, etc. A TEG includes a first side configured to be exposed to a relatively colder environment and a second side configured to be exposed to a relatively warmer environment (e.g., relative to each other). The relatively colder environment or the relatively warmer environment may be outside, may be within the ATM itself, or may be inside a building (e.g., within an area enclosed by the wall of the TTW ATM). For example, when it is cold outside (e.g., relative to the inside of the ATM or the building), the cold side of the TEG may be exposed to the outside, with the warm side of the TEG inside the ATM or inside the building. When it is warm outside (e.g., relative to the inside of the ATM or the building), the sides of the TEG may be switched.

A TEG generates renewable energy that may be used for a TTW ATM deployed in an area with an extreme environmental condition, for example. The TEG may harness a temperature difference from the inside of the ATM or a building and the external environment. The TEG may be used in either a high temperature outside area or a low temperature outside area, with the TEG orientation being varied. The TEG may be used to power a component of the ATM, such as a light emitting diode (LED), such as a media entry exit indicator (MEEI) LED (e.g., card entry, media entry, media exit, etc.), a DC fan, or another low power device. In some examples, power generated by the TEG may be stored in an optional battery. In some examples, to increase thermal conductivity, an aluminum type heatsink may be installed on one or more surfaces of the TEG to increase surface area of heat transfer. The power generated by the TEG may offset or reduce some power consumption from an existing ATM power line.

A TEG may be installed on a fascia area of an ATM, on a sleeve of the ATM, or the like. Depending on environmental conditions, an orientation of a TEG may be varied. In some examples, a set of TEGs are electrically connected in series. A TEG may be installed with a heatsink (e.g., Aluminum material) on one or more surfaces to increase surface area, thus increasing the rate of heat transfer.

For high temperature environmental conditions a hot temperature surface of the TEG faces the external environment, and the cold temperature surface of the TEG faces an inside of the ATM or faces an interior of a building (e.g., a financial institution) in a controlled environment.

For low temperature environmental conditions a cold temperature surface of the TEG faces the external environment, and the hot temperature surface faces an inside of the ATM or faces an interior of a building (e.g., a financial institution) in a controlled environment.

A temperature gradient may be used (e.g., between the external environment and an interior of the ATM or an interior of a building (e.g., a financial institution) in a controlled environment) to generate power for one or more components of the ATM.

Figure 2:
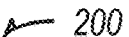
Figure 3:
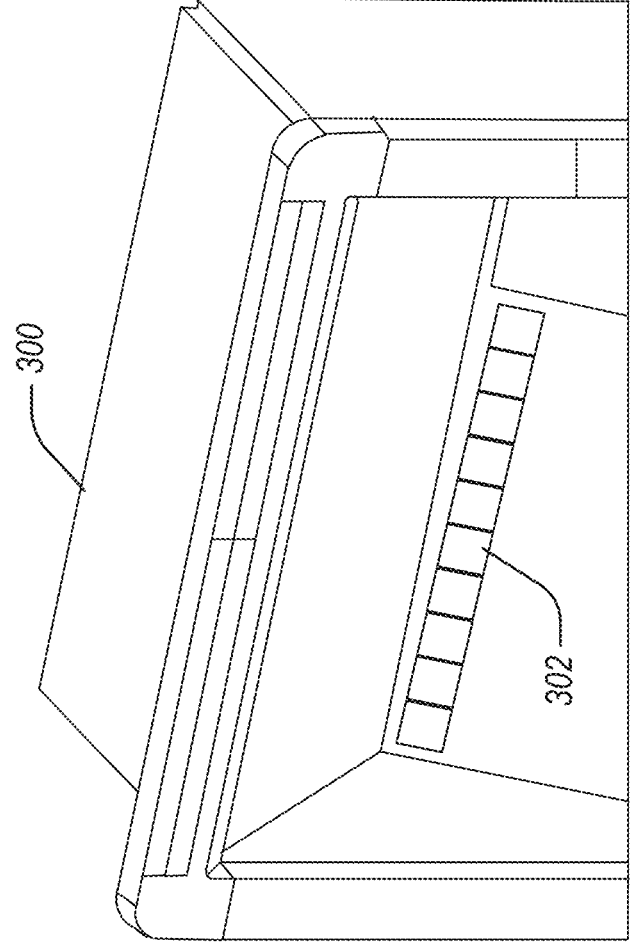

FIGS. 1-3 illustrate example ATMs with arranged TEGs in accordance with some examples. FIG. 1 illustrates an example ATM system 100 with TEGs (e.g., TEG 106) in a fascia 102 of the ATM in accordance with some examples. The ATM system 100 shown in FIG. 1 is a TTW ATM, embedded in a wall 104. The TEGs in the fascia 102 may be exposed to an external environment on a first face of the TEGs. In an example, an internal temperature of the ATM may be used as a temperature differential to the external environment. In another example, an internal portion of a building that is inside the wall 104 may be used as a temperature differential to the external environment. An internal temperature of the ATM or the building may be controlled, for example set to a temperature within a range, such as 20° C. to 35° C. An external environment temperature may be used when below the range or above the range, such as less than negative 20° C. to 0° C. for cold areas or greater than 35° C. to 50° C. for hot areas.

The TEG 106 may be installed on the fascia 102 to generate electricity from the temperature differential. For example, in a cold area, a cold face of the TEG 106 may face the external environment and a warm face of the TEG 106 may face an internal environment (e.g., the ATM or the building inside the wall 104). In a warm area, a warm face of the TEG 106 may face the external environment and a cold face of the TEG 106 may face an internal environment (e.g., the ATM or the building inside the wall 104). In an example, the TEGs, such as the TEG 106 may be installed in series on the fascia 102. In some examples, the TEG 102 may be used to generate power with temperature differences as small as 5° C. between the a cold face and a warm face. A larger temperature differential may be used to generate a greater amount of power.

FIG. 2 illustrates an example ATM system 200 with TEGs (e.g., TEG 206) in a sleeve 208 of the ATM in accordance with some examples. The ATM system 200 shown in FIG. 2 is a TTW ATM, embedded in a wall 204. Similar to the ATM described with respect to FIG. 1, the ATM of FIG. 2 may include TEGs, such as TEG 206. The TEG 206 is installed on the sleeve 208 of the ATM rather than the fascia as shown in FIG. 1. The TEGs in the sleeve 208 may be exposed to an external environment on a first face of the TEGs. In an example, an internal temperature of the ATM may be used as a temperature differential to the external environment. In another example, an internal portion of a building that is inside the wall 204 may be used as a temperature differential to the external environment. An internal temperature of the ATM or the building may be controlled, for example set to a temperature within a range, such as 20° C. to 35° C. An external environment temperature may be used when below the range or above the range, such as less than negative 20° C. to 0° C. for cold areas or greater than 35° C. to 50° C. for hot areas.

The TEG 206 may be installed on the sleeve 208 to generate electricity from the temperature differential. For example, in a cold area, a cold face of the TEG 206 may face the external environment and a warm face of the TEG 206 may face an internal environment (e.g., the ATM or the building inside the wall 204). In a warm area, a warm face of the TEG 206 may face the external environment and a cold face of the TEG 206 may face an internal environment (e.g., the ATM or the building inside the wall 204). In an example, the TEGs, such as the TEG 206 may be installed in series on the sleeve 208.

The ATM may include multiple TEGs arranged in different orientations or locations to maximize power generation potential. For example, a first TEG may be positioned on the fascia and a second TEG may be positioned on the sleeve, allowing the ATM to potentially harness different temperature differentials. For example, one position may have a greater temperature differential in the winter and another in the summer.

FIG. 3 illustrates an example ATM 300 with TEGs (e.g., TEG 302) arranged in series in accordance with some examples. The TEGs installed on the ATM 300 are connected to each other in series. By connecting the TEGs in series, power or current flow may be increased (e.g., when compared to separately connected TEGs, such as those connected in parallel). The TEGs generate direct current (DC) which may be used to power DC components in the ATM 300, such as an LED, a fan, etc.

Figure 4:
FIG. 4 illustrates an example internal arrangement of a TEG in an ATM in accordance with some examples.

FIG. 4 illustrates an example internal arrangement of a TEG 402 in an ATM 400 in accordance with some examples. The ATM 400 illustrates an example arrangement with the TEG 402 in contact with a first heat sink 404 on a first face of the TEG 402 and in contact with a second heat sink 406 on a second face of the TEG 402, the second face opposite the first face. The ATM 400 includes a airflow guide 408 to direct air past the TEG 402 (e.g., to direct hot air past a hot face of the TEG 402 or to direct cool air across a cool side of the TEG 402. In other examples, an airflow guide may be used to direct hot or cold air away from a face of the TEG 402 (e.g., to direct hot air away from a cold side of the TEG 402 or to direct cold air away from a hot side of the TEG 402). In the example ATM 400 shown in FIG. 4, a fan 410 (e.g., a DC fan) may be used to direct airflow past the TEG 402 (e.g., as described above with respect to the airflow guide 408). In some examples, power generated at the TEG 402 may be used to power the fan 410. The fan 410 may direct waste heat from one or more other components (not shown) of the ATM 400, such as a processor, a display, etc. towards or away from the TEG 402. The heat sink 404 or the heat sink 406 may be made of an aluminum material to increase a rate of heat transfer at the TEG 402.

Figure 5:
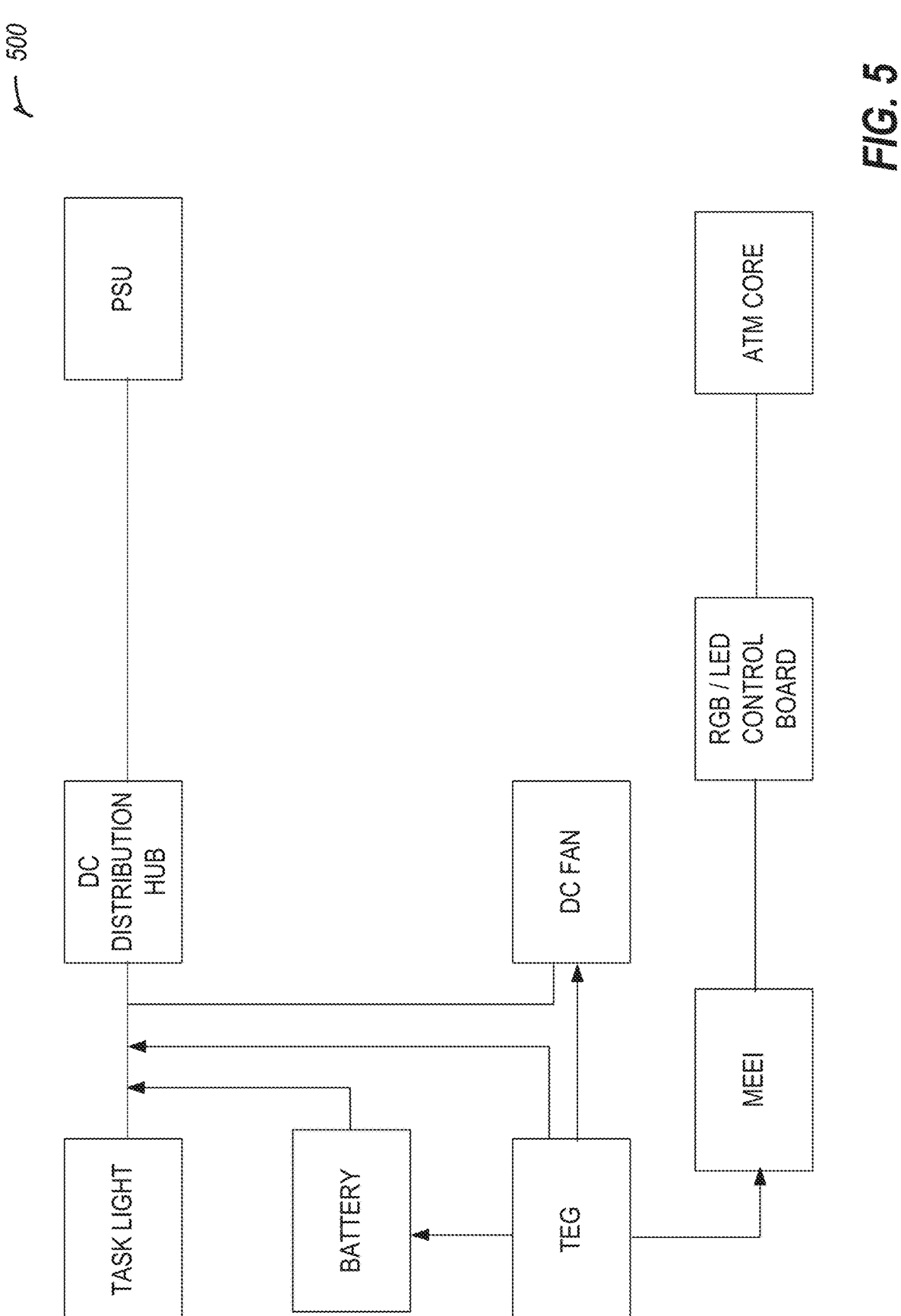
FIG. 5 illustrates an example conceptual architecture block diagram of power in an ATM in accordance with some examples.

FIG. 5 illustrates an example conceptual architecture block diagram 500 of power in an ATM in accordance with some examples. The block diagram 500 includes components of an ATM, which may are shown with electrical connection lines. For example, a TEG may be electrically connected to supply power to a DC fan (e.g., at 24 volts DC), an MEEI LED, a task light, a DC distribution hub, or a battery. The battery may store energy that may be sent to the DC distribution hub. The DC distribution hub may coordinate distribution of power to one or more components (e.g., a task light, a PSU, a DC fan, etc.). An ATM core may be separately powered, for example via an electrical grid. A RGB or LED control board may be supplied power by the electrical grid or by the TEG. The arrangement shown in FIG. 5 may be modified such that components that are not electrically connected to the TEG may be powered by the TEG (e.g., via sending power to the ATM core or the DC distribution hub). The TEG, the ATM core, or the DC distribution hub may include a controller to determine what component to power from the TEG (e.g., the MEEI, the DC fan, the battery, etc.). In some examples, the controller may control charging the battery, for example whether to charge the batter, when to charge the battery, whether to trickle charge the battery, whether to supply all outbound power from the TEG to the battery, or the like. For example, the controller may determine that the TEG is has available power exceeding the power needs of a set of components in the ATM and cause the TEG to power the battery. The controller may determine that the battery is reaching capacity (e.g., 80% full) and switch to trickle charging the battery.

Figure 6:
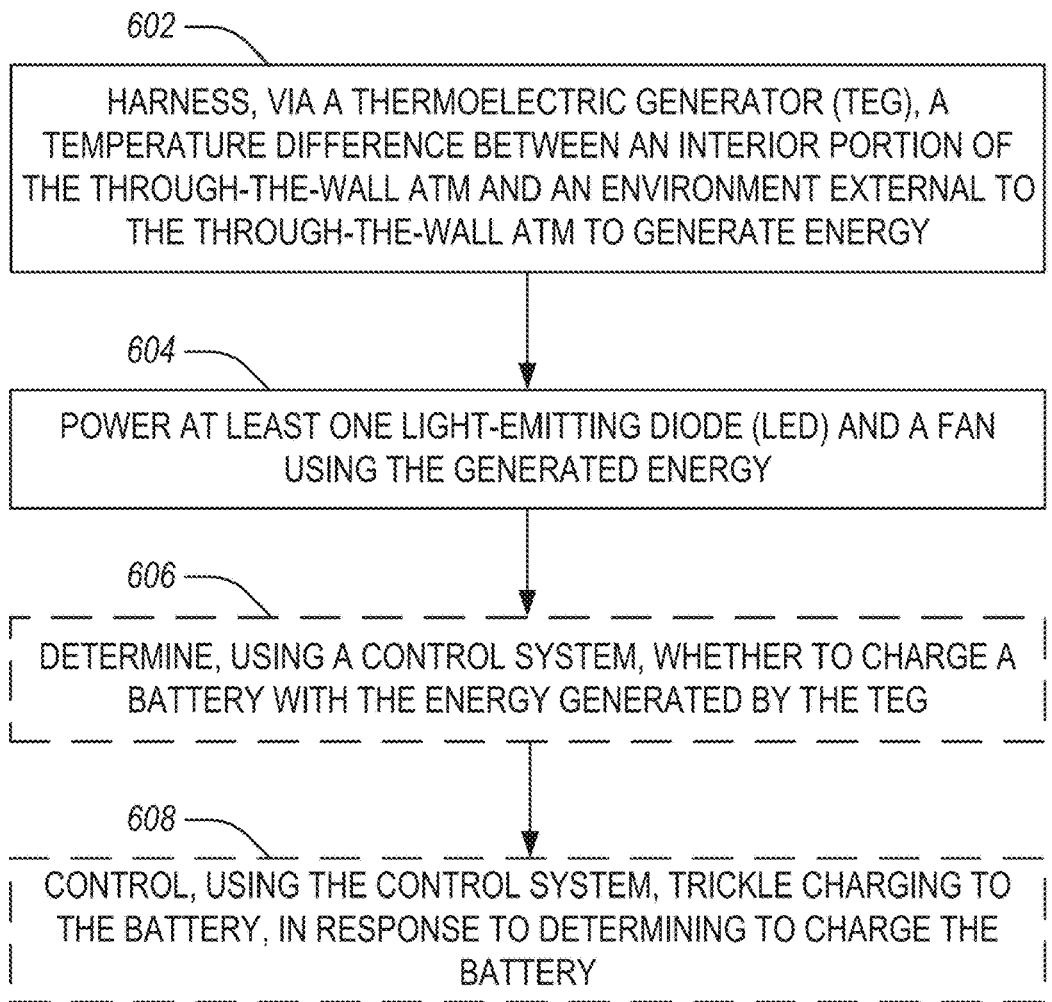
FIG. 6 illustrates generally a flowchart showing a technique for generating power via a thermoelectric generator (TEG) at a through-the-wall automated teller machine (ATM) in accordance with some examples.

FIG. 6 illustrates generally a flowchart showing a technique 600 for generating power via a thermoelectric generator (TEG) at a through-the-wall automated teller machine (ATM) in accordance with some examples.

The technique 600 includes an operation 602 to harness, via a thermoelectric generator (TEG), a temperature difference between an interior portion of the through-the-wall ATM and an environment external to the through-the-wall ATM to generate energy. In an example, the TEG includes a first face exposed to the interior portion of the through-the-wall ATM and a second face opposite the first face, the second face exposed to the environment. In an example, the external environment is an inside of a financial institution. The through-the-wall ATM may form a portion of a wall of the financial institution, with the inside of the financial institution being warmer than the interior portion of the through-the-wall ATM. In another example, the environment is an external environment, for example colder than the interior portion of the through-the-wall ATM or warmer than the interior portion of the through-the-wall ATM. The TEG may include at least one heat sink, such as an aluminum heat sink. The ATM may include an airflow guide positioned adjacent to the at least one heat sink, with the airflow guide directing airflow across the at least one heat sink or reducing mixing of air between the interior portion of the through-the-wall ATM and the environment. The ATM may include a plurality of TEGs, including the TEG, for example arranged in series. The TEG may be disposed on a fascia area of the through-the-wall ATM or on a sleeve of the through-the-wall ATM.

The technique 600 includes an operation 604 to power at least one light-emitting diode (LED) and a fan using the generated energy. The fan may be a (DC) powered fan. The LED may be a media entry exit indicator (MEEI) LED.

In an example, the ATM includes a battery to store energy generated by the TEG. The technique 600 includes an optional operation 606 to determine, using a control system, whether to charge the battery with the energy generated by the TEG. The technique 600 includes an optional operation 608 to control, using the control system, trickle charging to the battery, in response to determining to charge the battery.

Figure 7:
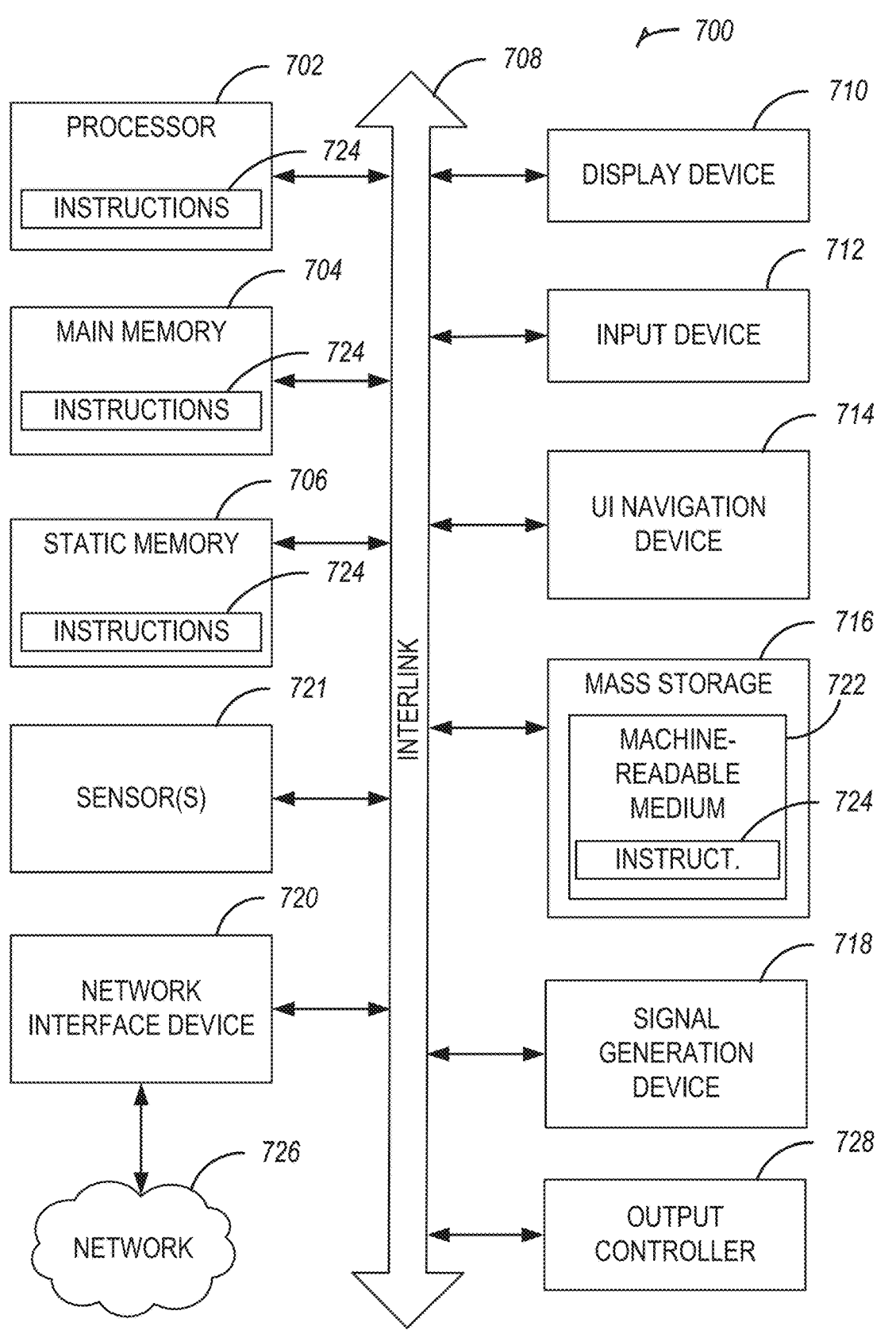
FIG. 7 illustrates generally an example of a block diagram of a machine upon which any one or more of the techniques discussed herein may perform in accordance with some examples.

FIG. 7 illustrates generally an example of a block diagram of a machine 700 upon which any one or more of the techniques discussed herein may perform in accordance with some examples. In alternative examples, the machine 700 may operate as a standalone device or may be connected (e.g., networked) to other machines. In a networked deployment, the machine 700 may operate in the capacity of a server machine, a client machine, or both in server-client network environments. In an example, the machine 700 may act as a peer machine in peer-to-peer (P2P) (or other distributed) network environment. The machine 700 may be a personal computer (PC), a tablet PC, a set-top box (STB), a personal digital assistant (PDA), a mobile telephone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate on, logic or a number of components, modules, or mechanisms. Modules are tangible entities (e.g., hardware) capable of performing specified operations when operating. A module includes hardware. In an example, the hardware may be specifically configured to carry out a specific operation (e.g., hardwired). In an example, the hardware may include configurable execution units (e.g., transistors, circuits, etc.) and a computer readable medium containing instructions, where the instructions configure the execution units to carry out a specific operation when in operation. The configuring may occur under the direction of the executions units or a loading mechanism. Accordingly, the execution units are communicatively coupled to the computer readable medium when the device is operating. In this example, the execution units may be a member of more than one module. For example, under operation, the execution units may be configured by a first set of instructions to implement a first module at one point in time and reconfigured by a second set of instructions to implement a second module.

Machine (e.g., computer system) 700 may include a hardware processor 702 (e.g., a central processing unit (CPU), a graphics processing unit (GPU), a hardware processor core, or any combination thereof), a main memory 704 and a static memory 706, some or all of which may communicate with each other via an interlink (e.g., bus) 708. The machine 700 may further include a display unit 710, an alphanumeric input device 712 (e.g., a keyboard), and a user interface (UI) navigation device 714 (e.g., a mouse). In an example, the display unit 710, alphanumeric input device 712 and UI navigation device 714 may be a touch screen display. The machine 700 may additionally include a storage device (e.g., drive unit) 716, a signal generation device 718 (e.g., a speaker), a network interface device 720, and one or more sensors 721, such as a global positioning system (GPS) sensor, compass, accelerometer, or other sensor. The machine 700 may include an output controller 728, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device 716 may include a machine readable medium 722 that is non-transitory on which is stored one or more sets of data structures or instructions 724 (e.g., software) embodying or utilized by any one or more of the techniques or functions described herein. The instructions 724 may also reside, completely or at least partially, within the main memory 704, within static memory 706, or within the hardware processor 702 during execution thereof by the machine 700. In an example, one or any combination of the hardware processor 702, the main memory 704, the static memory 706, or the storage device 716 may constitute machine readable media.

While the machine readable medium 722 is illustrated as a single medium, the term "machine readable medium" may include a single medium or multiple media (e.g., a centralized or distributed database, and/or associated caches and servers) configured to store the one or more instructions 724.

The term "machine readable medium" may include any medium that is capable of storing, encoding, or carrying instructions for execution by the machine 700 and that cause the machine 700 to perform any one or more of the techniques of the present disclosure, or that is capable of storing, encoding or carrying data structures used by or associated with such instructions. Non-limiting machine readable medium examples may include solid-state memories, and optical and magnetic media. Specific examples of machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 724 may further be transmitted or received over a communications network 726 using a transmission medium via the network interface device 720 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), or wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 720 may include one or more physical jacks (e.g., Ethernet, coaxial, or phone jacks) or one or more antennas to connect to the communications network 726. In an example, the network interface device 720 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine 700, and includes digital or analog communications signals or other intangible medium to facilitate communication of such software.

Each of these non-limiting examples may stand on its own, or may be combined in various permutations or combinations with one or more of the other examples.

Example 1 is a through-the-wall automated teller machine (ATM) comprising: a fan; at least one light-emitting diode (LED); and a thermoelectric generator (TEG) configured to harness a temperature difference between an interior portion of the through-the-wall ATM and an environment external to the through-the-wall ATM to generate energy to power the fan and the at least one LED, the TEG including a first face exposed to the interior portion of the through-the-wall ATM and a second face opposite the first face, the second face exposed to the environment.

In Example 2, the subject matter of Example 1 includes, wherein the fan is a direct current (DC) powered fan.

In Example 3, the subject matter of Examples 1-2 includes, wherein the LED is a media entry exit indicator (MEEI) LED.

In Example 4, the subject matter of Examples 1-3 includes, wherein the external environment is an inside of a financial institution, and wherein the through-the-wall ATM forms a portion of a wall of the financial institution, the inside of the financial institution being warmer than the interior portion of the through-the-wall ATM.

In Example 5, the subject matter of Examples 1-4 includes, wherein the environment is an external environment, the external environment being colder than the interior portion of the through-the-wall ATM.

In Example 6, the subject matter of Examples 1-5 includes, wherein the TEG includes at least one heat sink.

In Example 7, the subject matter of Example 6 includes, wherein the at least one heat sink is made of aluminum.

In Example 8, the subject matter of Examples 6-7 includes, wherein the through-the-wall ATM further comprises an airflow guide positioned adjacent to the at least one heat sink, the airflow guide configured to: direct airflow across the at least one heat sink; and reduce mixing of air between the interior portion of the through-the-wall ATM and the environment.

In Example 9, the subject matter of Examples 1-8 includes, wherein the ATM further comprises a battery to store the energy generated by the TEG.

In Example 10, the subject matter of Example 9 includes, wherein the through-the-wall ATM further comprises a control system configured to: determine whether to charge the battery with the energy generated by the TEG; and control trickle charging to the battery, in response to determining to charge the battery.

In Example 11, the subject matter of Examples 1-10 includes, wherein the through-the-wall ATM further comprises a plurality of TEGs including the TEG, the plurality of TEGs arranged in series.

In Example 12, the subject matter of Examples 1-11 includes, wherein the TEG is disposed on a fascia area of the through-the-wall ATM or on a sleeve of the through-the-wall ATM.

Example 13 is a method of powering components of a through-the-wall automated teller machine (ATM), the method comprising: harnessing, via a thermoelectric generator (TEG), a temperature difference between an interior portion of the through-the-wall ATM and an environment external to the through-the-wall ATM to generate energy, the TEG including a first face exposed to the interior portion of the through-the-wall ATM and a second face opposite the first face, the second face exposed to the environment; and powering at least one light-emitting diode (LED) and a fan using the generated energy.

In Example 14, the subject matter of Example 13 includes, wherein the fan is a direct current (DC) powered fan, and wherein the LED is a media entry exit indicator (MEEI) LED.

In Example 15, the subject matter of Examples 13-14 includes, wherein the external environment is an inside of a financial institution, and wherein the through-the-wall ATM forms a portion of a wall of the financial institution, the inside of the financial institution being warmer than the interior portion of the through-the-wall ATM.

In Example 16, the subject matter of Examples 13-15 includes, wherein the environment is an external environment, the external environment being colder than the interior portion of the through-the-wall ATM.

In Example 17, the subject matter of Examples 13-16 includes, wherein the TEG includes at least one heat sink.

In Example 18, the subject matter of Example 17 includes, wherein the through-the-wall ATM further comprises an airflow guide positioned adjacent to the at least one heat sink, the airflow guide configured to: direct airflow across the at least one heat sink; and reduce mixing of air between the interior portion of the through-the-wall ATM and the environment.

In Example 19, the subject matter of Examples 13-18 includes, determining, using a control system, whether to charge a battery with the energy generated by the TEG; and controlling, using the control system, trickle charging to the battery, in response to determining to charge the battery.

In Example 20, the subject matter of Examples 13-19 includes, wherein the through-the-wall ATM further comprises a plurality of TEGs including the TEG, the plurality of TEGs arranged in series.

Example 21 is at least one machine-readable medium including instructions that, when executed by processing circuitry, cause the processing circuitry to perform operations to implement of any of Examples 1-20.

Example 22 is an apparatus comprising means to implement of any of Examples 1-20.

Example 23 is a system to implement of any of Examples 1-20.

Example 24 is a method to implement of any of Examples 1-20.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact disks and digital video disks), magnetic cassettes, memory cards or sticks, random access memories (RAMs), read only memories (ROMs), and the like.

What is claimed is:

1. A through-the-wall automated teller machine (ATM) comprising:
   a fan;
   at least one light-emitting diode (LED); and
   a thermoelectric generator (TEG) configured to harness a temperature difference between an interior portion of the through-the-wall ATM and an environment external to the through-the-wall ATM to generate energy to power the fan and the at least one LED, the TEG including a first face exposed to the interior portion of the through-the-wall ATM and a second face opposite the first face, the second face exposed to the environment.

2. The through-the-wall ATM of claim 1, wherein the fan is a direct current (DC) powered fan.

3. The through-the-wall ATM of claim 1, wherein the LED is a media entry exit indicator (MEEI) LED.

4. The through-the-wall ATM of claim 1, wherein the external environment is an inside of a financial institution, and wherein the through-the-wall ATM forms a portion of a wall of the financial institution, the inside of the financial institution being warmer than the interior portion of the through-the-wall ATM.

5. The through-the-wall ATM of claim 1, wherein the environment is an external environment, the external environment being colder than the interior portion of the through-the-wall ATM.

6. The through-the-wall ATM of claim 1, wherein the TEG includes at least one heat sink.

7. The through-the-wall ATM of claim 6, wherein the at least one heat sink is made of aluminum.

8. The through-the-wall ATM of claim 6, wherein the through-the-wall ATM further comprises an airflow guide positioned adjacent to the at least one heat sink, the airflow guide configured to:
   direct airflow across the at least one heat sink; and
   reduce mixing of air between the interior portion of the through-the-wall ATM and the environment.

9. The through-the-wall ATM of claim 1, wherein the ATM further comprises a battery to store the energy generated by the TEG.

10

10. The through-the-wall ATM of claim 9, wherein the through-the-wall ATM further comprises a control system configured to:
   determine whether to charge the battery with the energy generated by the TEG; and
   control trickle charging to the battery, in response to determining to charge the battery.

11. The through-the-wall ATM of claim 1, wherein the through-the-wall ATM further comprises a plurality of TEGs including the TEG, the plurality of TEGs arranged in series.

12. The through-the-wall ATM of claim 1, wherein the TEG is disposed on a fascia area of the through-the-wall ATM or on a sleeve of the through-the-wall ATM.

13. A method of powering components of a through-the-wall automated teller machine (ATM), the method comprising:
   harnessing, via a thermoelectric generator (TEG), a temperature difference between an interior portion of the through-the-wall ATM and an environment external to the through-the-wall ATM to generate energy, the TEG including a first face exposed to the interior portion of the through-the-wall ATM and a second face opposite the first face, the second face exposed to the environment; and
   powering at least one light-emitting diode (LED) and a fan using the generated energy.

14. The method of claim 13, wherein the fan is a direct current (DC) powered fan, and wherein the LED is a media entry exit indicator (MEEI) LED.

15. The method of claim 13, wherein the external environment is an inside of a financial institution, and wherein the through-the-wall ATM forms a portion of a wall of the financial institution, the inside of the financial institution being warmer than the interior portion of the through-the-wall ATM.

16. The method of claim 13, wherein the environment is an external environment, the external environment being colder than the interior portion of the through-the-wall ATM.

17. The method of claim 13, wherein the TEG includes at least one heat sink.

18. The method of claim 17, wherein the through-the-wall ATM further comprises an airflow guide positioned adjacent to the at least one heat sink, the airflow guide configured to:
   direct airflow across the at least one heat sink; and
   reduce mixing of air between the interior portion of the through-the-wall ATM and the environment.

19. The method of claim 13, further comprising:
   determining, using a control system, whether to charge a battery with the energy generated by the TEG; and
   controlling, using the control system, trickle charging to the battery, in response to determining to charge the battery.

20. The method of claim 13, wherein the through-the-wall ATM further comprises a plurality of TEGs including the TEG, the plurality of TEGs arranged in series.

* * * * *